US009293266B2

(12) United States Patent
Chianelli et al.

(10) Patent No.: US 9,293,266 B2
(45) Date of Patent: Mar. 22, 2016

(54) ASPHALTENE BASED PHOTOVOLTAIC DEVICES

(71) Applicants: Board of Regents, The University of Texas System, Austin, TX (US); Sandia Corporation, Albuquerque, NM (US)

(72) Inventors: Russell R. Chianelli, El Paso, TX (US); Karina Castillo, Edinburg, TX (US); Vipin Gupta, Las Cruces, NM (US); Ali M. Qudah, El Paso, TX (US); Brenda Torres, El Paso, TX (US); Rajib E. Abujnah, El Paso, TX (US)

(73) Assignees: Board of Regents, The University of Texas System, Austin, TX (US); Sandia Corporation, Austin, TX (US)

( * ) Notice: Subject to any disclaimer, the term of this patent is extended or adjusted under 35 U.S.C. 154(b) by 124 days.

(21) Appl. No.: 14/262,519

(22) Filed: Apr. 25, 2014

(65) Prior Publication Data

US 2014/0234026 A1    Aug. 21, 2014

Related U.S. Application Data

(63) Continuation-in-part of application No. 13/744,027, filed on Jan. 17, 2013, now Pat. No. 8,748,740, which is a continuation of application No. 12/833,488, filed on Jul. 9, 2010, now Pat. No. 8,389,853.

(60) Provisional application No. 61/224,791, filed on Jul. 10, 2009.

(51) Int. Cl.
*H01L 51/46* (2006.01)
*H01G 9/20* (2006.01)
(Continued)

(52) U.S. Cl.
CPC .............. *H01G 9/2059* (2013.01); *B82Y 10/00* (2013.01); *E01C 9/00* (2013.01); *H01G 9/2031* (2013.01); *H01L 51/0045* (2013.01); *Y02E 10/542* (2013.01); *Y02P 70/521* (2015.11)

(58) Field of Classification Search
CPC ............. H01L 51/0045; H01G 9/2004; H01G 9/2059; H01G 9/2031
USPC ....................................................... 136/263
See application file for complete search history.

(56) References Cited

U.S. PATENT DOCUMENTS 6,479,745 B2    11/2002    Yamanaka et al.
7,118,936 B2    10/2006    Kobayashi et al.
(Continued)

OTHER PUBLICATIONS

Brabec, Christoph J., "Organic photovoltaics: technology and market," Solar Energy Materials & Solar Cells 83, 2004, pp. 273-292.
(Continued)

*Primary Examiner* — Jayne Mershon
(74) *Attorney, Agent, or Firm* — Norton Rose Fulbright US LLP

(57) ABSTRACT

Photovoltaic devices and methods of making the same, are disclosed herein. The cell comprises a photovoltaic device that comprises a first electrically conductive layer comprising a photo-sensitized electrode; at least one photoelectrochemical layer comprising metal-oxide particles, an electrolyte solution comprising at least one asphaltene fraction, wherein the metal-oxide particles are optionally dispersed in a surfactant; and a second electrically conductive layer comprising a counter-electrode, wherein the second electrically conductive layer comprises one or more conductive elements comprising carbon, graphite, soot, carbon allotropes or any combinations thereof.

32 Claims, 5 Drawing Sheets

(51) Int. Cl.
*E01C 9/00* (2006.01)
*B82Y 10/00* (2011.01)
*H01L 51/00* (2006.01)

(56) References Cited

U.S. PATENT DOCUMENTS

| | | |
|---|---|---|
| 7,332,782 B2 | 2/2008 | Tomita |
| 2004/0211461 A1 | 10/2004 | Murai et al. |
| 2007/0181178 A1 | 8/2007 | Sohn et al. |
| 2007/0251574 A1 | 11/2007 | Fujimaki et al. |
| 2009/0114283 A1 | 5/2009 | Lee et al. |

OTHER PUBLICATIONS

Gan, Wee Yong, et al., "Novel TiO2 thin film with non-UV activated superwetting and antifogging behaviours," Journal of Materials Chemistry, Feb. 9, 2007, pp. 952-954.

Gratzel, M., "Dye-sensitized solar cells," Journal of Photochemistry and Photobiology C: Photochemistry Reviews, 4, Jul. 1, 2003, pp. 145-153.

Hoshikawa, T., et al., "Impedance analysis for dye-sensitized solar cells with a three-electrode system," Journal of Electroanalytical Chemistry, Nov. 30, 2004, 577:339-348.

Ito, Seigo, et al., "Control of dark current in photoelectrochemical (TiO2/I⁻- I3⁻) and dye-sensitized solar cells," Chemical Communications, Jul. 1, 2005, 34-S, pp. 4351-4353.

Ito, Seigo, et al., "Fabrication of Screen-Printing Pastes From TiO2 Powders for Dye-Sensitised Solar Cells," Progress in Photovoltaics: Research and Applications, Mar. 20, 2007.

Kalowekamo, Joseph, et al., "Estimating the manufacturing cost of purely organic solar cells," Solar Energy, Feb. 5, 2009, pp. 1-8.

Lee, Kun-Mu, et al., "High efficiency quasi-solid-state dye-sensitized solar cell based on polyvinyidene fluoride-co-hexafluoro propylene containing propylene carbonate and acetonitrile as plasticizers," Journal of Photochemistry and Photobiology A: Chemistry, Jul. 2009, 207:224-230.

Lee, Byoung-Kuk, et al., "Enhanced efficiency of dye-sensitized solar cells by UV-03 treatment of TiO2 layer," Current Applied Physics, Mar. 2008, 9:404-408.

Liu, Weiqing, et al., "The effect of the series resistance in dye-sensitized solar cells explored by electron transport and back reaction using electrical and optical modulation techniques," Electrochimica Acta, Nov. 2009, 55:2338-2343.

Noaki, K., et al., "Improvement of efficiency of dye-sensitized solar cells based on analysis of equivalent circuit," ournal of Photochemistry and Photobiology A: Chemistry, May 2006, 182:296-305.

Rousseau, et al., "Multi-Donor Molecular Bulk Heterojunction Solar Cells: Improving Conversion Efficiency by Synergistic Dye Combinations," Journal of Materials Chemistry, (2009), 19:2298-2300.

Rousseau, et al., "BODIPY Derivatives as Donor Materials for Bulk Heterojunction Solar Cells," Chem. Commun., (2009), pp. 1673-1675.

Ruiz-Morales, Yosadara, et al., "Electronic Absorption Edge of Crude Oils and Asphaltenes Analyzed by Molecular Orbital Calculations with Optical Spectroscopy," Energy & Fuels, Jan. 2007, 21:944-952.

Salmanova, Ch. K., et al., "Transformations of Resins and Asphaltenes in Photoirradiation," Chemistry and Technology of Fuels and Oils, vol. 43, No. 5, Oct. 2007, pp. 39-42.

Shaheen, Sean E., et al., "Organic-Based Photovoltaics: Toward Low-Cost Power Generation," Mrs Bulletin, vol. 30, Jan. 2005, pp. 10-19.

Troshin, P.A., et al., "Organic Solar Cells: Structure, Materials, Critical Characteristics, and Outlook, "Nanotechnologies in Russia, Dec. 2007, vol. 3, Nos. 5-6, pp. 242-271.

Wang, J., et al., "The Properties of Asphaltenes and Their Interaction with Amphiphiles," Energy & Fuels, May 1, 2009, 23:3625-3631.

Zhang, Dongshe, et al., "Room-Temperature Synthesis of Porous Nanoparticulate Ti02 Films for Flexible Dye-Sensitized Solar Cells," Advanced Functional Materials, 2006, 16:1228-1234.

Mullins, Oliver C., et al., Asphaltenes, Heavy Oils, and Petroleomics, Springer Science+Business Media, LLC, 2007, Book.

Preparation of the working electrode

Sintering at 500   Dye absorption   Cell

Preparation of the Counter electrode

Holes drilling   Pt application   Air drying   Heat at 450

Cell building

Spacer application   Electrodes   Electrolyte submission   Contact application

US 9,293,266 B2

ASPHALTENE BASED PHOTOVOLTAIC DEVICES

CROSS-REFERENCE TO RELATED APPLICATIONS

This application is a Continuation-in-Part application of U.S. patent application Ser. No. 13/744,027, filed Jan. 17, 2013, which is a continuation of U.S. Ser. No. 12/833,488 filed Jul. 9, 2010, now U.S. Pat. No. 8,389,853, which claims priority to U.S. Provisional Application Ser. No. 61/224,791 filed Jul. 10, 2009, the entire contents of each of which is incorporated herein by reference.

STATEMENT OF FEDERALLY FUNDED RESEARCH

This invention was made with Government support under contract no. DE-AC04-94AL85000 awarded by the U.S. Department of Energy to Sandia Corporation. The Government has certain rights in the invention.

TECHNICAL FIELD OF THE INVENTION

The present invention relates in general to the field of photovoltaic devices.

BACKGROUND OF THE INVENTION

Without limiting the scope of the invention, its background is described in connection with the dye-sensitized solar cells.

United States Patent Application No. 20090114283, filed by Lee, et al., is directed to a dye-sensitized solar cell that includes a first substrate, a first electrode layer, a photosensitive dye layer, an electrolyte layer, a second electrode layer, and a second substrate. The first electrode layer is disposed on the first substrate. The photosensitive dye layer is disposed on the first electrode layer. The electrolyte layer is disposed on the photosensitive dye layer, and the electrolyte layer is composed of an organic electrolyte material. The second electrode layer is disposed on the electrolyte layer, and the second substrate is disposed on the second electrode layer. A stable and effective oxidation and reduction reaction is performed between the elements by the characteristics of the composition and the structure of the electrolyte material, thus improving the photoelectric conversion efficiency and the stability of the dye-sensitized solar cell.

United States Patent Application No. 20070251574, filed by Fujimaki, et al., is directed to a dye-sensitized solar cell that includes a first electrode having a photoelectric conversion layer, a second electrode disposed so as to oppose the first electrode, and electrolyte filled at least in between the first electrode and second electrode, the first electrode is constructed with a plurality of first electrode layers disposed superposed in a direction that is opposite the second electrode.

United States Patent Application No. 20040211461, filed by Murai, et al., is also directed to a dye-sensitized solar cell. Briefly, the invention is a dye-sensitized solar cell comprising a semiconductor electrode containing a dye and carboxylic compound, the dye and carboxylic compound being carried on a surface of the semiconductor electrode, a counter electrode, and an electrolyte composition provided between the semiconductor electrode and the counter electrode, and containing an electrolyte that contains iodine and molten salt of iodide.

U.S. Pat. No. 7,332,782, issued to Tomita is directed to a dye-sensitized solar cell with high conversion efficiency. Briefly, the dye-sensitized solar cell has, between an electrode (2) formed on a surface of a transparent substrate (1) and a counter electrode (6), a light-absorbing layer (3) containing light-absorbing particles carrying dye and an electrolyte layer (5), characterized in that the light-absorbing layer (3) containing light-scattering particles (4) different in size from the light-absorbing particles. In such a dye-sensitized solar cell according to the present invention, the energy of light, which passes through a light-absorbing layer in a conventional cell structure, can be strongly absorbed by the dye in the light-absorbing layer of the present invention. This will increase the conversion efficiency and output current of the dye-sensitized solar cell.

U.S. Pat. No. 7,118,936, issued to Kobayashi, et al., is directed to an organic dye-sensitized metal oxide semiconductor electrode and manufacture and organic dye-sensitized solar cells. Briefly, a semiconductor electrode of organic dye-sensitized metal oxide having a semiconductor layer of metal oxide is said to be easily prepared for an organic dye-sensitized solar cell. The semiconductor electrode of organic dye-sensitized metal oxide comprises a substrate having a transparent electrode thereon, a semiconductor layer of metal oxide provided on the electrode and an organic dye absorbed on a surface of the semiconductor layer, the semiconductor layer being formed by a vapor deposition process.

U.S. Pat. No. 6,479,745, issued to Yamanaka, et al., is directed to a dye-sensitized solar cell and method of manufacturing the same. Briefly, the dye-sensitized solar cell comprises a porous semiconductor layer in which a dye is adsorbed and an electrolyte, which are sandwiched between a transparent conductive film formed on a surface of a transparent substrate and a conductive substrate, wherein the electrolyte is retained in a crosslinked polymer compound.

SUMMARY OF THE INVENTION

In one embodiment, the present invention includes a photovoltaic device comprising: a first electrically conductive layer comprising a photo-sensitized electrode; at least one photoelectrochemical layer comprising metal-oxide particles, an electrolyte solution comprising at least one asphaltene fraction, wherein the metal-oxide particles are optionally dispersed in a surfactant; and a second electrically conductive layer comprising a counter-electrode, wherein the second electrically conductive layer comprises one or more conductive elements comprising carbon, graphite, soot, carbon allotropes or any combinations thereof. In one aspect, the asphaltene fraction is further defined as being selected from at least one of: a first asphaltene fraction that dissolves in 75:25 volume-to-volume n-pentane to toluene; a second asphaltene fraction that dissolves in 85:15 volume-to-volume n-pentane to toluene; a third asphaltene fraction that dissolves in 90:10 volume-to-volume n-pentane to toluene; and an asphaltene fraction that does not dissolve in 90:10 volume-to-volume n-pentane to toluene.

The present invention describes a photovoltaic device and methods of making a photovoltaic cell comprising: a first electrically conductive layer; at least one photoelectrochemical layer comprising metal-oxide particles, an electrolyte solution comprising at least one asphaltene fraction; and a second electrically conductive layer. In certain aspects, the present invention can be used to make a novel excitonic device, which does not require the use of an electrolyte.

In one embodiment the present invention is a photovoltaic device comprising a first electrically conductive layer at least one photoelectrochemical layer comprising metal-oxide particles, an electrolyte solution and an asphaltene dye and a second electrically conductive layer comprising one or more conductive elements. In one aspect of the photovoltaic device of the present invention the metal-oxide particles comprise titanium dioxide or other photocatalytic materials optionally dispersed in a surfactant, wherein the surfactants are selected from a group comprising Triton, alkyl polyoxides, alkylphenols, alkyl polyglucosides, fatty alcohols, polysorbates, and other non-ionic surfactants.

In another aspect the one or more conductive elements comprise carbon, graphite, soot, carbon allotropes, or any combinations thereof and the first, second or both electrically conductive layers are flexible metal wherein the first, second of both electrically conductive layers comprises platinum coated indium-tin oxide glass. In yet another aspect the photoelectrochemical layer is defined further as a comprising a semiconductor material and the electrolyte solution comprises iodide salt and iodine. The first electrically conductive layer of the photovoltaic cell of the present invention comprises a photo-sensitized electrode, and the second electrically conductive layer a counter-electrode.

In another embodiment the photovoltaic cell of the present invention comprises a first electrically conductive layer, at least one semiconductor layer comprising an electrolyte solution comprising at least one asphaltene fraction, wherein the electrolyte comprises iodide salt and iodine, and a second electrically conductive layer comprising at least one or more conductive elements, wherein the conductive element comprises soot. In one aspect the metal-oxide particles comprise titanium dioxide or other photocatalytic materials optionally dispersed in a surfactant selected from a group comprising Triton, alkyl polyoxides, alkylphenols, alkyl polyglucosides, fatty alcohols, polysorbates, and other non-ionic surfactants. In another aspect the one or more conductive elements comprise carbon, graphite, soot, carbon allotropes, or any combinations thereof. The first, second or both electrically conductive layers are flexible metal comprising of platinum coated indium-tin oxide glass. The photoelectrochemical layer of the photovoltaic cell of the present invention is defined further as a comprising a semiconductor material. The electrolyte solution comprises iodide salt and iodine. The first electrically conductive layer comprises a photo-sensitized electrode, and the second electrically conductive layer a counter-electrode.

In yet another embodiment the photovoltaic cell of the present invention comprises a first electrically conductive layer, at least one semiconductor layer comprising a mixture of an electrolyte solution comprising at least one asphaltene fraction, wherein the electrolyte comprises iodide salt and iodine and a second electrically conductive layer comprising one or more conductive elements. In one aspect the asphaltene to $CoMoS_2$ ratio in the mixture is 100:1, 75:1, 50:1, 25:1, 10:1, 5:1, 2:1, or 1:1 and the metal-oxide particles comprise titanium dioxide or other photocatalytic materials optionally dispersed in a surfactant and at least one semiconductor layer comprises a mixture of asphaltene with one or more sulfides are selected from a group comprising $CoMoS_2$, CdS, $Cu_2S$, $NiMoS_2$, $FeMoS_2$, Co, Ni, Fe, Cu and other transition metal sulfides copper indium gallium diselenide, and indium-gallium sulfide. The one or more conductive elements comprise carbon, graphite, soot, carbon allotropes, or any combinations thereof. In another aspect the first, second or both electrically conductive layers are a flexible metal and the first, second of both electrically conductive layers comprises platinum coated indium-tin oxide glass. In yet another aspect the photoelectrochemical layer is defined further as a comprising a semiconductor material and the electrolyte solution comprises iodide salt and iodine. The first electrically conductive layer comprises a photo-sensitized electrode, and the second electrically conductive layer a counter-electrode.

In one embodiment the photovoltaic cell of the present invention comprises (i) a first electrically conductive layer, (ii) at least one semiconductor layer comprising an electrolyte solution comprising at least one asphaltene fraction, wherein the electrolyte comprises iodide salt and iodine, and (iii) a second electrically conductive layer comprising one or more conductive elements. In one aspect the metal-oxide particles comprise titanium dioxide or other photocatalytic materials optionally dispersed in a surfactant and at least one semiconductor layer comprises one or more sulfides selected from a group comprising $CoMoS_2$, CdS, $Cu_2S$, copper indium gallium diselenide, and indium-gallium sulfide. In another aspect the one or more conductive elements comprise carbon, graphite, soot, carbon allotropes, or any combinations thereof and the first, second or both electrically conductive layers are flexible metal. In another aspect the first, second of both electrically conductive layers comprises platinum coated indium-tin oxide glass. In yet another aspect the photoelectrochemical layer is defined further as a comprising a semiconductor material. In a certain aspect the electrolyte solution comprises iodide salt and iodine. The first electrically conductive layer of the present invention further comprises a photo-sensitized electrode, and the second electrically conductive layer a counter-electrode.

The present invention further describes a method of making a photovoltaic device comprising: depositing at least one photoelectrochemical layer comprising metal-oxide particles, an electrolyte solution comprising at least one asphaltene fraction on a first electrically conductive layer, and depositing a semiconductor layer on a second electrically conductive layer. In one aspect of the method the metal-oxide particles comprise titanium dioxide or other photocatalytic materials optionally dispersed in a surfactant. In another aspect the one or more sulfides are selected from a group comprising $CoMoS_2$, CdS, $Cu_2S$, $NiMoS_2$, $FeMoS_2$, Co, Ni, Fe, Cu and other transition metal sulfides, copper indium gallium diselenide, and indium-gallium sulfide. In yet another aspect the semiconductor layer comprises carbon, graphite, soot, carbon allotropes, or any combinations thereof and the first, second or both electrically conductive layers are flexible metal. The first, second of both electrically conductive layers comprises platinum coated indium-tin oxide glass and the photoelectrochemical layer is defined further as a comprising a semiconductor material. The electrolyte solution comprises iodide salt and iodine and the first electrically conductive layer comprises a photo-sensitized electrode, and the second electrically conductive layer a counter-electrode.

The method of the present invention further comprises the steps of forming a roadway comprising the photovoltaic device by: depositing the first electrically conductive layer on a road bed, depositing the at least one photoelectrochemical layer comprising metal-oxide particles, an electrolyte solution and an asphaltene dye a mixture of asphaltene and $CoMoS_2$, $CoMoS_2$ or any combinations thereof on the first electrically conductive layer; and at least partially coating the photoelectrochemical layer with the second electrically conductive layer.

The present invention further describes a photovoltaic device comprising: a first electrically conductive layer, at least one photoelectrochemical layer comprising metal-oxide particles, and an electrolyte solution comprising at least one asphaltene fraction. In one aspect the metal-oxide particles comprise titanium dioxide or other photocatalytic materials optionally dispersed in a surfactant. The electron donor substance comprises asphaltenes, metal sulfides, mixtures of asphaltenes and metal sulfides, Ruthenium or Rhodium-dye complexes, metal free dyes, or any combinations thereof. The device of the present invention further comprises one or more conductive elements comprise carbon, graphite, soot, carbon allotropes, or any combinations thereof. The first, second of both electrically conductive layers comprises platinum coated indium-tin oxide glass, wherein the first electrically conductive layer comprises a photo-sensitized electrode, and the second electrically conductive layer a counter-electrode.

In one embodiment the present invention describes a photovoltaic roadway comprising a first electrically conductive layer on a road bed, at least one photoelectrochemical layer comprising metal-oxide particles, an electrolyte solution comprising at least one asphaltene fraction disposed on the first electrically conductive layer, and at least partially coating the photoelectrochemical layer with the second electrically conductive layer, wherein the voltage created between the first and second electrically conductive layers is gathered along the roadway.

BRIEF DESCRIPTION OF THE DRAWINGS

For a more complete understanding of the features and advantages of the present invention, reference is now made to the detailed description of the invention along with the accompanying figures and in which.

DETAILED DESCRIPTION OF THE INVENTION

Figure 1:
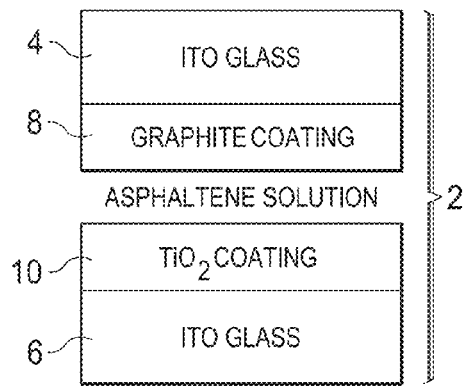
FIG. 1 shows a photovoltaic cell made with asphaltene solution.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

Photovoltaic solar cells have shown great promise in capturing solar energy and providing clean and renewable electrical energy that can reduce the world's dependency on fossil fuels, and reduce emission of $CO_2$. However, in spite of the recent rapid growth of the solar industry, the high cost of photovoltaic solar cells has remained a limiting factor for the implementation of the solar electricity in a large scale. Currently, the dominant photovoltaic technology is based on solid-state p/n junction devices, in which semiconductor absorbers produce a build-in electrical field separating electron-hole pairs and the electron-hole pairs, thus generating electricity when illuminated. These types of solar cells have high power conversion efficiency, but suffer from high manufacturing and material cost.

The group of molecular-based materials combinations often referred to as 'organic' or 'molecular' photovoltaic materials are of current great interest because of their potential in significantly reducing cost. The materials of current interest are conjugated molecular species, such as polymers, molecules and dyes, which are capable of absorbing light and conducting charge and thereby acting as organic semiconductors (1). Their attraction lies primarily in the possibility of processing such materials directly from solution with the cost of the photoactive material falling by an order of magnitude (2, 3). Additionally, the less challenging manufacturing environment, compared, for example, with crystalline silicon wafer production, promises to reduce the capital cost for production facilities and to make the technology more widely accessible, especially in developing countries (4). Moreover, it is also believed that if such materials are naturally synthesized and stable the cost could be further reduced. Dye Sensitized Solar Cells (DSSC) are one of the low cost alternatives for the conventional p/n junction based solar cells, and commercially promising because it can be made from low-cost materials and do not require elaborated manufacturing facilities. At the moment there are dyes that can produce DSSCs with conversion efficiencies over 10% (5). However, these types of dye suffer from the drawback that they are based on the rare Ru transition metal.

Asphaltenes are one of the materials that fulfill the requirements of organic semiconductors; i.e. absorbing a broad range of visible and near infrared light capable of conducting charge stable and naturally abundant (6,7,8). Asphaltenes are organic materials that contains large number of structures, in particular high molecular weight fused aromatic hydrocarbons components with heteroatoms such as sulfur and nitrogen (9). Asphaltenes also contain organic molecules such as Porphyrin already used in DSSC with promising performance. Most of the researchers have found that the sign of asphaltene charge is positive in organic solvent such as heptanes, toluene, ethanol, and nitro methane as studied by Zetametry and electrophoresis (10,11). The origin of the electric charges is a consequence of an electron transfer between the organic solid particles and the liquid organic phase (12). Asphaltenes are excellent candidates for use in DSSC as we report. This article introduces the first real data on using asphaltene fractions as sensitizer in DSSC and describes ways of improvements (13).

As used herein the "photovoltaic", also abbreviated as (PV), refers to the direct conversion of light energy into electricity. As used herein, the term "photovoltaic device" refers to a complete set of components for converting light energy into electricity by the photovoltaic process. The term "electrically conductive" is used herein to describe a property of a material that involves its ability to transfer electricity.

As used herein the term "asphaltene" refers to a high molecular weight fraction of crude oils that are insoluble in paraffinic solvents. "Asphaltenes" are characterized by a high average molecular weight (about 1000 and up to 5,000) and very broad molecular weight distribution (up to 10,000) and high coking tendency.

The term "surfactant" used herein is intended to include compounds commonly referred to as wetting agents, dispersing agents, and emulsification agents. Typical surfactants include the alkylarylsulfonates, the fatty alcohol sulfates, sodium salt of naphthalenesulfonic acid, alkylaryl polyether alcohols, long chain quaternary ammonium compounds, sodium salts of petroleum-derived alkylsulfonic acids, polyoxyethylene-sorbitan monolaurate, and the like. These dispersing and wetting agents are sold under numerous trademarks and may either be pure compounds, mixtures of compounds of the same general group, or they may be mixtures of compounds of different classes.

The term "semiconductor" in its broadest sense refers to a material that has an electrical conductivity due to flowing electrons (as opposed to ionic conductivity) which is intermediate in magnitude between that of a conductor and an insulator. Semiconductor devices include the various types of transistor, solar cells, many kinds of diodes including the light-emitting diode, the silicon controlled rectifier, and digital and analog integrated circuits.

As used herein, the term "electrolyte solute" refers to a conductive species, such as a salt, which behaves as an electrolyte (i.e., transports an electric current via long-range motion of ions).

The term "photocatalytic material" is used herein to refer to a material exhibiting photocatalysis, that is, the acceleration of a chemical reaction by radiant energy (as light) acting either directly or by exciting a substance that in turn catalyzes the main reaction.

Photovoltaic solar energy works by transforming a fraction of solar radiation into electricity by means of solar cells, which are connected together to form a photovoltaic solar cell module. The solar cells currently on the market are made up of inorganic materials such as silicon. A great deal of research has been aimed at developing solar cells made up of organic (carbon-compound based) semiconductors. Although their performance is still considerably lower than that of cells based on crystalline silicon (around 5% efficiency as compared with 15% for silicon cells), they present numerous advantages. Unlike crystalline silicon, which has to be produced at very high temperatures, they can be manufactured cheaply with low energy cost and environmental impact. Moreover, the fact that they are made using solution processes (for instance from inks or paints) makes it possible to cover large areas and flexible substrates such as films and fabrics. Organic solar cells are not intended to compete with silicon, but rather to be used for specific applications, such as packaging, clothing, flexible screens, and recharging cell phones and laptops. However, in the longer term, they could make a significant contribution to the photovoltaic conversion of solar energy, as long as there is a continuous search for new, more efficient and stable materials.

Over the past ten years or so, most of the research has been focused on developing organic cells in which the active light-absorbing material is made up of long conjugated polymer chains. Although these cells are the most efficient yet discovered, the use of polymers poses a certain number of problems: synthesis, purification, control of the molecular structure and mass, and the distribution of different lengths of chain (polydispersity). In order to overcome these obstacles, Roncali, et al. has developed a novel approach based on replacing polymers by conjugated molecules with a clearly defined structure. Whereas the conversion efficiencies of the initial prototypes published in 2005 were of the order of 0.20%, collaboration between Roncali et al. and Ziessel et al. has recently succeeded in reaching conversion efficiencies of 1.70%, which are among the highest known for this type of cell until now. New classes of active material specifically adapted to such cells are currently being synthesized in the laboratories.

EXAMPLE 1

Asphaltene Photovoltaic Cells

The present invention may also be made as an excitonic device, which does not require the use of an electrolyte. As used herein, the term "exciton" and the devices made thereby refer to a chemical configuration in which an electron is bound to a hole, in this way the exciton can be manipulated within a semiconductor chip to and from a light source, that is, the exciton is formed with light, processed and then converted back into light.

FIG. 1 shows the assembly of a photovoltaic cell 2. Two pieces (4 and 6) of Indium-Tin oxide glass were used as the two electrodes for the assembly of the cell 2. The dimensions of the glass (4 and 6) were 25×25×0.7 mm and they were obtained from Delta's Technologies, Limited. The bottom electrode 6 of Indium-Tin oxide was coated with Degussa 25 $TiO_2$ 10. Degussa 25 $TiO_2$ 10 was mixed with Triton surfactant until the Degussa 25 $TiO_2$ 10 powder was paste like consistency. Then it was spread out on the Indium-Tin oxide glass 6 and dried for 20 min at a 200° C. temperature. It was then cool down and soaked in a solution of asphaltene (1 g)/toluene (50 mL). It was soaked for about 3 h. Then it was pat dried. The top electrode 4 of Indium-Tin oxide was coated with sooth 8. Two electrodes 4 and 6 were sandwiched together as shown in FIG. 1. The two electrodes 4 and 6 were sandwiched together offset one from the other to make the contacts and measure the voltage. Two alligator clips (not shown) were used to keep the two electrodes 4 and 6 together. Then few drops of an electrolyte solution KI-ethylene glycol were added to the edges of the cell 2. The voltage was measured with a standard voltmeter. On a sunny day it gave 0.5 volts and kept producing the same voltage for two weeks.

Figure 2:
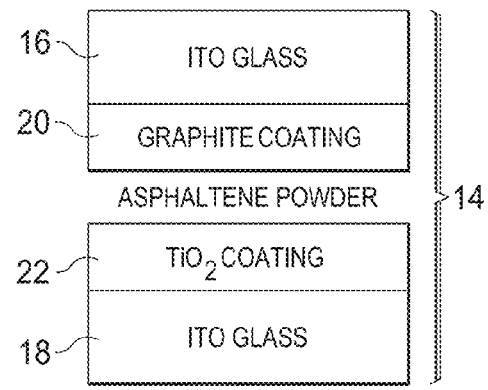
FIG. 2 shows a photovoltaic cell made with asphaltene in the powder form.

FIG. 2 shows the assembly of a photovoltaic cell 14. Two pieces (16 and 18) of Indium-Tin oxide glass were used as the two electrodes for the assembly of the cell 14. The dimensions of the glass were 25×25×0.7 mm and they were obtained from Delta's Technologies, Limited. The bottom electrode 18 of Indium-Tin oxide was coated with Degussa 25 $TiO_2$ 22. Degussa 25 $TiO_2$ 22 was mixed with Triton surfactant until the Degussa 25 $TiO_2$ 22 powder was paste like consistency. Then it was spread out on the Indium-Tin oxide glass 18 and dried for 20 min at a 200° C. temperature. It was allowed to cool down. Asphaltenes (0.001 g) were spread out on the glass. The top electrode 16 of Indium-Tin oxide was coated with sooth 20. Two electrodes 16 and 18 were sandwiched together as shown in FIG. 2. The two electrodes 16 and 18 were sandwiched together offset one from the other to make the contacts and measure the voltage. Two alligator clips (not shown) were used to keep the two electrodes 16 and 18 together. Then few drops of an electrolyte solution KI-ethylene glycol were added to the edges of the cell 14. The voltage was measured with a standard voltmeter. On a sunny day it gave 0.6 volts and kept producing the same voltage for 1 week.

Figure 3:
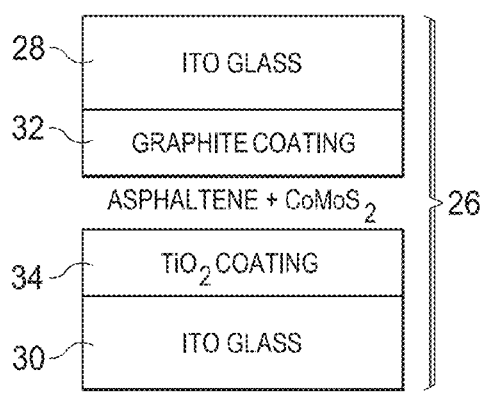
FIG. 3 shows a photovoltaic cell made with a mixture of asphaltene and $CoMoS_2$ in the powder form.

FIG. 3 shows the assembly of a photovoltaic cell 26. Two pieces (28 and 30) of Indium-Tin oxide glass were used as the two electrodes for the assembly of the cell 26. The dimensions of the glass were 25×25×0.7 mm and they were obtained from Delta's Technologies, Limited. The bottom electrode 30 of Indium-Tin oxide was coated with Degussa 25 $TiO_2$ 34. Degussa 25 $TiO_2$ 34 was mixed with Triton surfactant until the Degussa 25 $TiO_2$ powder 34 was paste like consistency. Then it was spread out on the Indium-Tin oxide glass 30 and dried for 20 min at a 200° C. temperature. A mechanical mixture of asphaltene and $CoMoS_2$ was performed in a ratio 10:1. The 0.01 g of the mixture was spread out on the Indium-Tin oxide glass 30 coated with $TiO_2$ 34. The top electrode 28 of Indium-Tin oxide was coated with sooth. Two electrodes 28 and 30 were sandwiched together as shown in FIG. 3. The two electrodes 28 and 30 were sandwiched together offset one from the other to make the contacts and measure the voltage. Two alligator clips (not shown) were used to keep the two electrodes 28 and 30 together. Then few drops of an electrolyte solution KI-ethylene glycol were added to the edges of the cell 26. The voltage was measured with a standard voltmeter. On a sunny day it gave 0.7 volts and kept producing the same voltage for 3 weeks.

Figure 4:
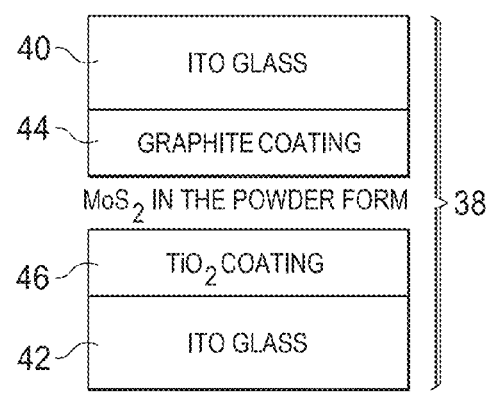
FIG. 4 shows a photovoltaic cell made with $MoS_2$ in the powder form.

FIG. 4 shows the assembly of a photovoltaic cell 38. Two pieces (40 and 42) of Indium-Tin oxide glass were used as the two electrodes for the assembly of the cell 38. The dimensions of the glass were 25×25×0.7 mm and they were obtained from Delta's Technologies, Limited. The bottom electrode of Indium-Tin 42 oxide was coated with Degussa 25 $TiO_2$ 46. Degussa 25 $TiO_2$ 46 was mixed with Triton surfactant until the Degussa 25 $TiO_2$ powder 46 was paste like consistency. Then it was spread out on the Indium-Tin oxide glass 42 and dried for 20 min at a 200° C. temperature. $CoMoS_2$ (0.01 g) was spread out on the Indium-Tin oxide glass 42 coated with $TiO_2$ 46. The top electrode 40 of Indium-Tin oxide was coated with sooth 44. Two electrodes 40 and 42 were sandwiched together as shown in FIG. 4. The two electrodes 40 and 42 were sandwiched together offset one from the other to make the contacts and measure the voltage. Two alligator clips (not shown) were used to keep the two electrodes 40 and 42 together. Then few drops of an electrolyte solution KI-ethylene glycol were added to the edges of the cell 38. The voltage was measured with a standard voltmeter. On a sunny day it gave 0.5 volts and kept producing the same voltage for 1 month.

Figure 5:
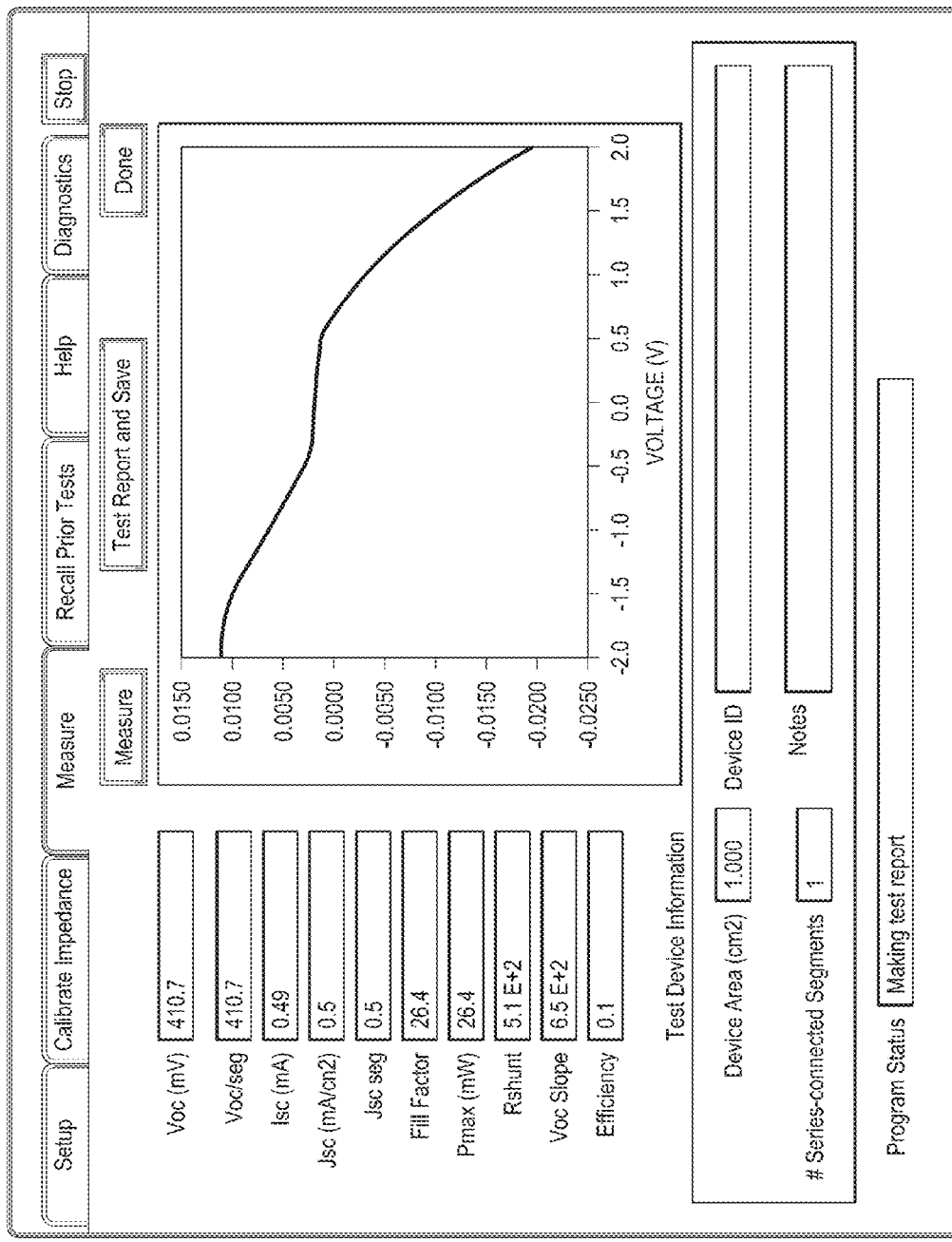
FIG. 5 is a graph of the IV curve of asphalthene solar cell.

IV measurements: The IV measurements were performed using a Peak Power Measuring Device and I-V Curve Tracer for Photovoltaic Module with the following dimensions: 48×16×35 cm. There is a relationship between the current-voltage obtained from solar devices. This relationship is often represented as a graph, between an electric current and a corresponding voltage. These graphs are used to determine the basic parameters of a device and to model its behavior in an electrical circuit. IV measurements were performed on the cells. FIG. 5 shows the graph corresponding to cell 38.

Figure 6:
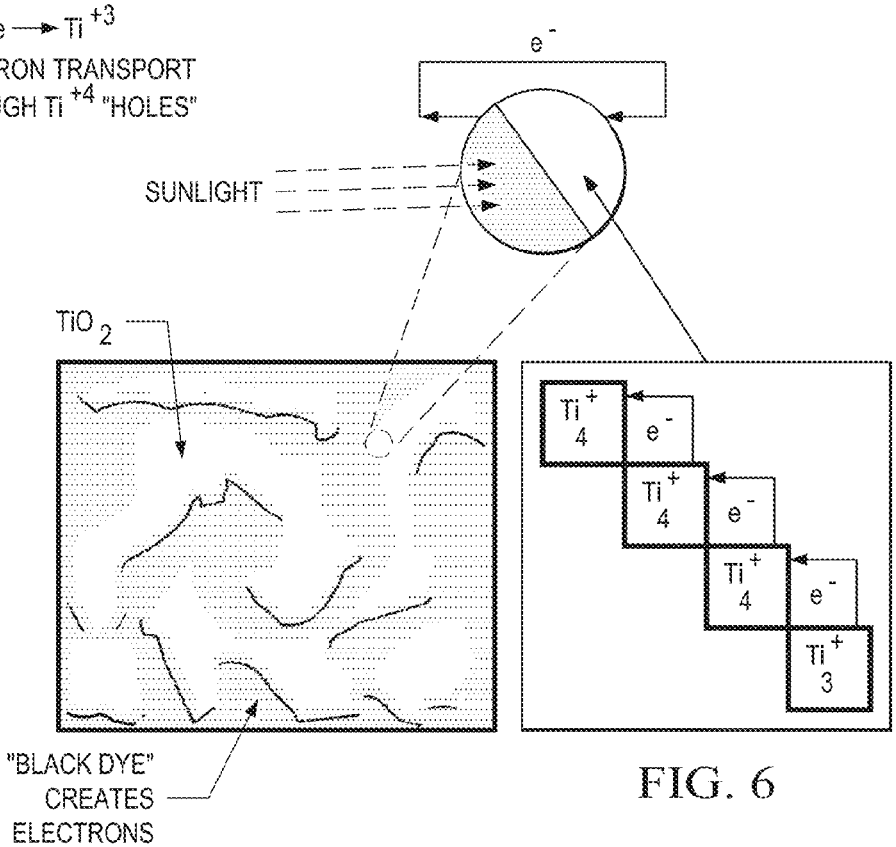
FIG. 6 is a schematic showing the conversion of light energy to electrical energy in an asphaltene containing photovoltaic cell.

FIG. 6 is a schematic representation of the mechanism by which a photovoltaic cell containing asphaltene converts light energy to electrical energy. The sunlight is incident on the photovoltaic cell comprising asphaltene (electron donor) mixed in with the $TiO_2$. The photons are converted into electrons and they move from hole to hole ($Ti^{+3}$ to $Ti^{+4}$). The presence of the asphaltene in the photovoltaic cell of the present invention obviates the necessity of using an electrolyte or electrolyte solution for the transfer of the electrons.

Different organic dyes have been tested for dye sensitized solar cells. It is proposed to use asphaltenes as an organic dye. Asphaltenes have shown to be able to produce voltage. Four different cells were tested. Asphaltene in the liquid and solid form were tested. The cells produce slightly better voltage when the asphaltene is used as a solid. This is maybe due to the fact that in the solid form the asphaltenes are more concentrated that in the liquid form. It has also been observed as the layer of asphaltene is ticker the voltage produced is better. This is contrary to what is usually expected in ordinary dye sensitized cells. It has been reported these cells are coated using a spin coater which provides a really thin coating on the electrodes. Cell #3 was assembled using $CoMoS_2$. It has been reported $MoS_2$ has solar cell applications. However, promoted systems such as $CoMoS_2$ and $NiMoS_2$ have not been reported in the literature. Cell #3 was assembled using $CoMoS_2$ to improve the conductive properties of the asphaltenes. The results show they were improved maybe due to a synergistic effect between the asphaltenes and the catalyst. Cell #4 was assembled using only $CoMoS_2$ and it was really stable as expected. FIG. 5 shows the IV curve of the asphalthene solar cell.

TABLE 1

Results

| Cell # | Assembly | Voltage obtained | Stability of the cell |
|---|---|---|---|
| 1 | ITO glass coated with $TiO_2$. Then the glass was soaked in an asphalthene solution and pat dried. This electrode was assembled with the counter electrode. | 0.5 V | This cell produced voltage for 2 weeks. |
| 2 | ITO glass coated with $TiO_2$ and the asphaltenes were used in powder form. Again this electrode was assembled with a counter electrode. | 0.6 V | This cell produced voltage for a week. |
| 3 | ITO glass coated with $TiO_2$ and a mix of asphaltenes and $CoMoS_2$ in the powder form was used. This electrode was assembled with a counter electrode. | 0.7 V | This cell produced voltage for 3 weeks. |
| 4 | ITO glass was coated with $TiO_2$ and $MoS_2$ in the powder form was used. This electrode was assembled with the counter electrode. | 0.5 V | This cell produced voltage for 1 month. |

The results obtained using asphaltene as light harvesting materials in dye sanitized solar cells are presented in Tables 2-3. Asphaltene used below was hexane extracted asphaltene and the concentration was 0.25-0.5 gram asphaltene/liter toluene. Asphaltene fractionation method used was titration of asphaltene dissolved toluene with pentane till the precipitate started appearing.

TABLE 2

Results obtained using 0.5 gram asphaltene/liter toluene.

| Asphaltene Fractionation | First precipitate 100 ml pentane | Raw asphaltene in benzene solution | Raw asphaltene in toluene solution | Third | Second | Fourth precipitate 200 ml pentane |
|---|---|---|---|---|---|---|
| Current (mA) | 0.2 | 0.01 | 0.1 | 1.5 | 1.1 | 2 |
| Voltage (mV) | 11.7 | 2.3 | 7.02 | 1.6 | 1.2 | 5.7 |

TABLE 3

Results obtained using 0.25 gram asphaltene/liter toluene.

| Asphaltene Fractionation | First precipitate 100 ml pentane | Raw asphaltene in benzene solution | Raw asphaltene in toluene solution | Third | Second | Fourth precipitate 200 ml pentane |
|---|---|---|---|---|---|---|
| Current (microA) |  |  |  |  | 12 | 4.1 |
| Voltage (mV) |  |  |  |  | 14 | 4.1 |
| Current (microA) |  |  |  |  | After 1 day | 7 |
| Voltage (mV) |  |  |  |  |  | 6.8 |

TABLE 4

Results obtained using two TiO$_2$ layers.

| Asphaltene Fractionation | First precipitate 100 ml pentane | Raw asphaltene in benzene solution | Raw asphaltene in toluene solution | Third | Second | Fourth precipitate 200 ml pentane |
|---|---|---|---|---|---|---|
| Current (microA) |  |  |  |  | 23 |  |
| Voltage (mV) |  |  |  |  | 52 |  |
| Current (microA) |  |  |  | After 1 day | 40 |  |
| Voltage (mV) |  |  |  |  | 273 |  |

The results presented in Tables 2 and 3 indicate that lower asphaltene concentration produces better quality cells. As indicated in literature, using two layers of TiO2 with different grain sizes, produce cells with higher voltages and currents (Table 4) and leaving the cells one day increase the efficiency.

EXAMPLE 2

Fractionation of Asphaltenes

Asphaltenes, are remnants of ancient photosynthetic plants and are today considered waste hydrocarbons that must be removed from petroleum for use as fuel and often find final their use as road tar. A Dye-Sensitized Solar Cell (DSSCs) is disclosed in which light is converted to electricity with conversion efficiencies approaching 1.8%. Extracted fractions of asphaltenes from Mexican Altamira crude oil were used as light absorbers in TiO$_2$-based DSSCs. The photovoltaic performances of the cells were analyzed by determining the I-V cell parameters such as OCV (open-circuit voltage), SCC (short-circuit current), FF (fill factor), and SR (series resistance). The overall energy conversion efficiency was also measured to correlate the effect of the different asphaltene portions that created significant improvement of the solar cell parameters. The sensitization of TiO$_2$ electrode with the best asphaltene fraction resulted in a maximum energy conversion efficiency of 1.8% for the solar cell with a maximum photocurrent density of 16.9 mA/cm$^2$. Improve performance was achieved by minimizing series resistance and improving the photo current and open circuit voltage. The cells have shown excellent life as suggested by photocatalytic polymerization of asphaltene materials when exposed to sunlight and air (see U.S. Pat. No. 8,389,853).

Commercial chemical agents and materials were used to prepare typical DSSCs, including TiO$_2$ pastes, electrolytes and transparent conductive glass Fluorine-doped Tin Oxide (FTO). The FTO was F-doped SnO$_2$ from Solarnoix TCO30-8 SA Switzerland 8 Ω/cm2/&, 3.3 mm thickness and 500-1000 nm transmittance. The TiO$_2$ paste was a highly transparent Ti-Nanoxide HT/SP and Ti-Nanoxide R/SP obtained from Solaronix Co. Switzerland. The paste contains approximately 18% wt. of nano-crystalline titanium dioxide with 8-10 nm particle size, with terpineol and other organic binders. A layer of highly porous Anatase nanocrystals is obtained after firing at 450° C. for 30 minutes. The obtained sintered layer is highly transparent. Two types of commercial electrolytes obtained from Solaronix Company were used in this study, which are Standard Iodolyte MPN-100. One was a 100 mM of tri-iodide in methoxypropionitrile solution. The second one was Iodolyte TG-50. It is Iodide Based Redox Electrolyte includes a 50 mM of tri-iodide in tetraglyme. The skilled artisan will recognize that the various thicknesses are exemplary only and can be varied depending on the specific needs.

Asphaltene extraction and purification. The crude oil (Mexican Altimira) was separated into Maltenes (n-heptane soluble) and Asphaltenes (n-heptane insoluble) by adding n-heptanes in a volume-volume ratio of n-heptanes to crude oil of 40:1, followed by filtration. 50 ml of crude oil was mixed with 2000 ml of n-heptane in a beaker, the mixture then stirred by magnetic tip overnight at room temperature. The solvent-to-oil ratio of 40:1 has been demonstrated to be suitable for avoiding errors in the determination of the amount of asphaltene fraction and in its characterization (14). The mixture was filtered using a filter paper with a pore diameter of 8 μm. The Asphaltene was purified by dissolving it completely in toluene at room temperature and then filtered again to remove debris. The resulting solution of Asphaltene and toluene was covered and kept under vacuum at room temperature for 24 hours to dry out. The precipitated asphaltene then weighted for determining asphaltene content, marked as crude asphaltene and will be referred to as un-fractionated asphaltene.

Fractionation of asphaltene. A sample of 3 grams asphaltene was dissolved in 100 mL toluene, and 300 mL n-pentane was added into the solution and mixing by stirring with a magnetic bar at ambient temperature. After adding n-pentane, the ratio of the total volume of the n-pentane to toluene is kept at 75/25 in volume. The solution was covered and stirred for half an hour for precipitation of insoluble. After filtration, the insoluble fraction was collected and dried at room temperature and left under vacuum overnight to obtain the first fraction (First precipitate. Fr.1) another amount of 270 ml pentane then added to the filtrate n-pentane and toluene to keep the ratio of the total volume of the n-pentane to toluene at 85/15 in volume.

The filtration and drying process then repeated to obtain the other fractions. Fraction two (Fr.2) was precipitated in a solution with an n-pentane to toluene ratio of 85/15 in volume. Similarly, samples (Third precipitate. Fr.3) (n-pentane to toluene=90/10), were precipitated in binary solutions with the increasing proportion of n-pentane. The last fraction, (fourth precipitate Fr. 4), was obtained by evaporating the solvents with the remaining asphaltene.

Preparation of the photo-electrode. The blocking layer was prepared in the following manner. The FTO glass was first cleaned in a detergent solution using an ultrasonic bath for 15 min, and then rinsed with water and ethanol, and treated with UV-$O_3$ cleaner for 20 minutes after that the FTO glass plates were immersed into a 50 mM aqueous solution of $TiCl_4$ at 70 C for 30 min and washed with water and ethanol. The $TiCl_4$ solution was formed by mixing 0.54 ml $TiCl_4$ in 100 ml of ultra water in an ice path.

Figure 7:
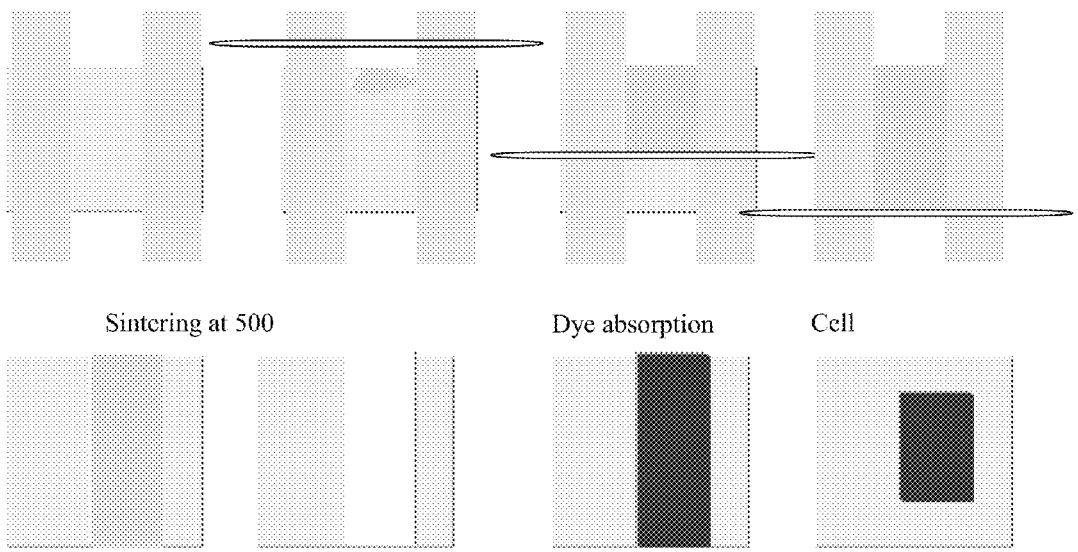
FIG. 7 is a series of drawings of the processes of manufacturing DSSC.
Figure 7:
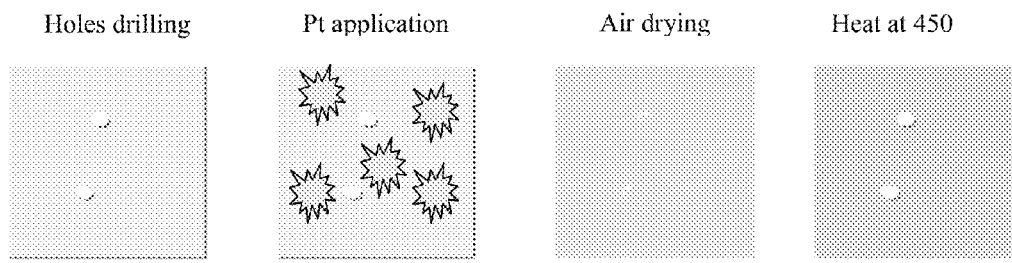
Figure 7:
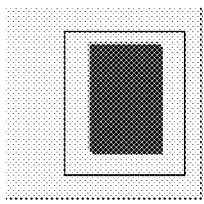
Figure 7:
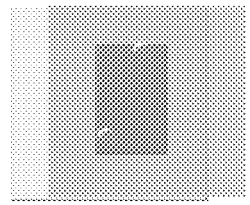
Figure 7:
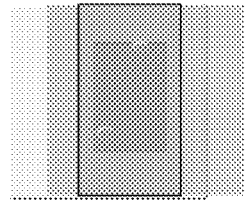
Figure 7:
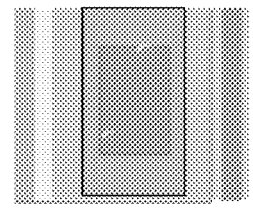

After applying the blocking layer, the photo electrodes were rinsed with d-water and ethanol and are ready for mesolayer application. The nanocrystalline $TiO_2$ layer was prepared by applying two layers of Ti-Nanoxide HT/SP paste by spreading (doctor blading). In the processes the FTO-coated glass was covered with two layers of parallel adhesive Scotch tape 1 cm apart to control the area and the thickness of the $TiO_2$ film (2.5×1 cm) see FIG. 7. Tape is used to hold the slides as well as to create the spacing required to produce the nanoparticle film. A solution of Ti-Nanoxide HT/SP paste is then applied to the top slide. A glass road is then used to draw the solution down to the slide of interest in a smooth and quick motion to coat the working electrode with nanoparticles. The film is then left to dry and the tape is removed. Films are treated at 500° C. for half an hour before soaking in a dye solution. This treatment process is used to remove any organic additives used as well as to sinter the nanoparticles together and remove any water from the active region of the cell. It is important to note that the samples should be hot (70° C.) when immersed in a dye solution to prevent $H_2O$ adsorption. The samples were left overnight in the dark for dye adsorption. The film is then cut into the desired cell area using a glasscutter and the titania film is scratched into by 5 mm squares using a razorblade FIG. 7.

Preparation of the counter electrode. Counter electrodes were fabricated by first drilling two holes using a diamond tip drill through an FTO piece of dimensions 2.5 cm by 5 cm. Drops of water were applied during the drilling process to prevent fracture of the glass. Once the electrodes have holes in them, they are washed with a d-water and detergent solution using an ultrasonic bath for 20 minutes to remove any organic residues, then washed in Ethanol solution for 20 minutes and Acetone for 20 minutes and then cleaned with UV-O3 cleaner for 20 minutes just before Pt application. Before being used in a cell, counter electrodes are coated with platinum using a 5 mM solution of Hexachloroplatinic acid in Ethanol. A few drops are placed on the counter electrode and left to dry for half an hour. The counter electrode is then heated at 450° C. in a furnace for half an hour. Upon cooling, the counter electrode is ready to be used in a working cell.

Assembling the cell. Surlyn spacers are cut from a large sheet of Surlyn sandwiched between two grid paper sheets, into the desired cell active area of 10 mm by 15 mm. After soaking the working electrode in dye solution overnight, the cells were assembled. To begin, the working electrodes are removed from the dye solution and washed with ethanol for 15 seconds waving mildly with tweezers. The electrode is then left to dry in a vertical position. The Surlyn gasket is placed around the titania square and the counter electrode is then placed above the working electrode sandwiching the Surlyn gasket and placed under the hot press for 30 seconds. Once the Surlyn is melted (easily seen visually), the cell is left to cool in the dark. The next phase of cell assembly is to fill the solar cell with electrolyte and seal the cell. To do this, a Solaronix' Vac'n'Fill Syringe was used to fill the electrolyte and Polyimide Film Tape with Acrylic Adhesive was used to cover the holes of the counter electrode see FIG. 7.

Introducing $TiO_2$ blocking Layer. The importance of a blocking layer in organic dye-sensitized solar cells has been demonstrated in many studies (14,15,16,17,). It was shown that upon the addition of a compact layer, the light-harvesting efficiencies were more than tripled. Such a compact layer improves the adhesion of the $TiO_2$ to the TCO and provides a larger $TiO_2$/TCO contact area and more effective electron transfer from the $TiO_2$ to the TCO by preventing the electron recombination process, which occurs in the interface between the redox electrolyte and the TCO surface. The compact layer can be fabricated by various methods such as sputter deposition, dip-coating, chemical vapor deposition, and spray pyrolysis (14,15,16,17). Especially, the fabrication of the $TiO_2$ compact layer using a $TiCl_4$ aqueous solution has been widely adopted and is the method used in this research (18).

To test the effect of the compact $TiO_2$ layer on the performance of asphaltene solar cells we made two asphaltene solar cells both with three $TiO_2$ layers (one compact and the other is Nano-crystalline layer). The used paste in these cells were commercial highly transparent Ti-Nanoxide HT/SP paste stated above, and the $TiO_2$ compact layer was prepared using a$TiCl_4$ aqueous solution. The asphaltene was un-fractionated unpurified Hunt asphaltene obtained from Altimera crude oil with utilized concentration of 0.5 g/l. The cells were tested under solar simulator at standard condition of 1.5 sun and the results are shown in Table 5. It is clear that, the introduction of $TiO_2$ compact layer prepared by the above mentioned method has increased the short circuit current, the close circuit voltage as well as overall cell efficiency.

TABLE 5

The effect of $TiO_2$ compact layer on asphaltene cell performance

| Cell id | Voc (v) | Jsc (mA/cm2) | FF % | IPCE % | Voc Slope (ohms) |
| --- | --- | --- | --- | --- | --- |
| Without compact | 0.4784 | 0.158 | 35.42 | 0.03 | 1830 |
| With compact | 0.420 | 0.388 | 46.46 | 0.07 | 398 |

The cells were tested under a solar simulator at standard condition of 1.5 sun and the results are shown in Table 5. It is clear that, the introduction of $TiO_2$ compact layer prepared by the above mentioned method has increased the short circuit current, the fill factor as well as overall cell efficiency.

Purifying asphaltene and using RTV silicone rubber mask layer on the photoelectrodes. A typical DSSC usually contains three interfaces formed by FTO/$TiO_2$, $TiO_2$/dye/electrolyte, and electrolyte/Pt-FTO. Simultaneously, electrons are transferred to tri-iodide at the $TiO_2$/dye/electrolyte interface and iodide is reduced to triiodide at the counter electrode. Series resistance in DSSC could arise from one of the above interfaces and have a great impact on cell performance. Varying the electrical properties of TCO, increasing the thickness of the electrolyte layer and the catalytic activity of the counter electrode, can raise the values of series resistance. Many researchers have found that, under short circuit conditions, electron transport was predominately affected by the series resistance in TCO-dye interface, and the electrolyte/Pt-TCO interface (19,20,21).

The extraction of asphaltene from crude oil involves dissolving the crude oil in n-heptanes followed by filtration. Asphaltene is the part of crude oil that does not dissolve and stay on top of the filter paper. Asphaltene extracted by this method could contain inorganic impurities, which may increase resistivity of the asphaltene films when applied on top of $TiO_2$. Hence, it may have an effect on charge transfer and increases the series resistance at $TiO_2$/asphaltene/electrolyte interface. For this purpose we employed the purification method described above to take off these impurities, before using it in DSSC.

In addition to that, when applying the compact layer in our previous experiments, the FTO glass was immersed completely in a $TiCl_4$ aqueous solution. Subsequently, $TiO_2$ compact layer was formed on all the TCO coating of the FTO glass used to prepare the photoelectrode. This has shown to increase the resistivity of the TCO layer, for that reason we used RTV silicone rubber paste as mask and cover the backside of glass completely and leave less than half side of conducting surface uncovered, which will be used to deposit the paste. Following these two strategies the efficiency of our cells has increased significantly when compared to previous cells from 0.07 see Table 5 (above) to 0.25 see Table 6 below.

TABLE 6

Purified Un-fractionated Hunt asphaltene cell parameters with 0.5 gm/l

| Iv parameter | 80 mW/cm2 | 100 mW/cm2 | 120 mW/cm2 |
| --- | --- | --- | --- |
| Voc (V) | 0.54 | 0.55 | 0.54 |
| Jsc (mA/cm2) | 0.59 | 0.72 | 0.91 |
| Fill factor % | 65.4 | 63.2 | 60.6 |
| Voc slope (ohms) | 43.6 | 42.6 | 38.7 |
| Efficiency (%) | 0.26 | 0.25 | 0.25 |

It is clear that the enhancement of cell efficiency in this cell was a consequence of decreasing series resistance and increasing close circuit current which leads to increase fill factor. This is in agreement of other people findings, which found an increase of FF with decrease in series resistance (22). To study the effect of varying light intensity on cell performance, the cell was tested under three different intensity levels 80, 100, and 120 mW/cm$^2$. As was expected higher light intensity produces higher current density but less fill factor and therefore lower cell efficiency. This observation is a well-known phenomenon in DSSCs (23). This is probably due to increase recommendation processes. The existence of the recombination process can be verified in the dark current measurement column five in the above table.

UV-Ozone treatment of the photo-electrode. The main components of the $TiO_2$ pastes utilized in this study as well as in most DSSC research labs more than $TiO_2$ particles are organic compounds used to disperse and link the semiconductor particles to form a network film. At high temperature sintering processes these compounds decompose and permit the formation of porous $TiO_2$ films with high surface area. However, some carbon atoms will probably deposit on top of $TiO_2$ particles and hinder the absorption of the dye, and the electron injection. $UV-O_3$ treatment is well known method to remove organics on transparent conducting oxides and has been widely used in organic electronic devices to clean the surface and modify the work function of ITO. Recently $UV-O_3$ treatment was applied to synthesize porous nano-particulate $TiO_2$ films at room temperature and remarkable improvement of photo-conversion efficiency was obtained using the treatment. It is believed that the main effect of the $UV-O_3$ treatment was reported to be the removal of residual organics and positive shift in the conduction band of the nano-crystalline titanium dioxide, which promotes electron injection from the dye (24,25).

To see if $UV-O_3$ treatment has an effect on the performance of asphaltene solar cells, $UV-O_3$ treatment was first applied on the last $TiO_2$ layer. Two asphaltene cells were made this time one with the commercial paste and the other is homemade paste described above. Both cells have given much better Voc and photocurrent when compared to the previous cells without $UV-O_3$ treatments see Table 7.

TABLE 7 the effect of UV-O treatment on top $TiO_2$ layer

| Cell ID | Voc (V) | Jsc mA/cm$^2$ | FF % | IPCE % |
| --- | --- | --- | --- | --- |
| Ti HT/SP + R | 0.806 | 8.51 | 15 | 1.03 |
| H P25 + R | 0.809 | 6.77 | 14.7 | 0.8 |

After, the $UV-O_3$ treatment on top layer of the photo-electrode showed improvement in cell operation, we apply $UV-O_3$ in three processing steps on bare FTO before the compact layer, before and after the compact layer and after the mesolayer. The used asphaltene here was fr.2 asphaltene with applying concentration of 1 mg/ml. Due to difficulty of applying the previous sealing material, the sealant has changed to Polypropylene w/ Rubber Medium Adhesive tape with 228.6 micrometers thick obtained from Grainger company item no 6JT54, the adhesive was not strong enough so some drops of crazy glue was put in on top of the tape between the electrodes. So the thickness was further increased a few micrometers. The results are shown in Table 8.

The efficiency of these cells has increased four times when compared with the ones without $UV-O_3$ treatment. The improvement in efficiency was a result of a big boost in both short circuit current and open circuit voltage. This enhancement was a result of increase in asphaltene absorption, eliminating organic contamination and therefore, higher photon capture and higher electron injection. However these cells shows very low fill factor. The decrease in the fill factor is due to increasing the electrolyte thickness as a result of increasing the sealant layer. The electrolyte ions will take longer time to reach the counter electrode before it reduced back. Similar results were observed with increasing the electrolyte thickness.

TABLE 8

The effect of ozone treatment on the asphaltene DSSC

| IPCE (%) | Voc (V) | Jsc (mA/cm^2) | FF (%) | FTO UVO | CL UVO | ML UVO |
| --- | --- | --- | --- | --- | --- | --- |
| 1.44 | 0.8252 | 13.19 | 13.1 | X | | X |
| 1.34 | 0.7818 | 13.55 | 12.9 | X | X | |
| 0.76 | 0.7790 | 7.74 | 12.2 | X | X | X |

The low photo current in asphaltene solar cell when $UV-O_3$ treatment was done on all the three $TiO_2$ layers was probably due to electrolyte touching the counter electrode because of improper sealing. So changing the sealant is vital at this point.

Varying asphaltene fraction. The open circuit voltage and short circuit current are both depend on the extent of light absorption. The most straightforward way to increase JSC is to absorb a greater fraction of the incident light. The optical gap of the Ru dye in the most efficient DSSC to date is 1.8 eV, allowing it to absorb essentially all the light out to 700 nm. Increasing the photocurrent density requires decreasing the optical gap to extend the dye's absorption into the near infrared. Different asphaltene fractions can be used to increase short circuit current is to try. Fractionation of asphaltene produces slightly different absorption spectra (see FIG. 8).

Neglecting the fill factor at the moment, the cells made of fr. 4, which is the most toluene soluble fraction, produces the less photocurrent and photo voltage when compared to the other asphaltene fractions. The less soluble asphaltene part (fraction one) generates higher photo voltage but lower photocurrent then fr.2, (see Table 9) fr.3, and un-fractionated asphaltene.

TABLE 9

Asphaltene fraction cell parameters

| IPCE (%) | Voc (V) | Jsc (mA/cm^2) | FF (%) | Frac # |
|---|---|---|---|---|
| 1.80 | 0.7793 | 13.69 | 16.6 | 3 |
| 1.38 | 0.7098 | 4.76 | 40.1 | 4 |
| 1.02 | 0.7724 | 10.52 | 13.0 | 1 |
| 1.76 | 0.7744 | 13.45 | 13.0 | Unfrac. |

Figure 8:
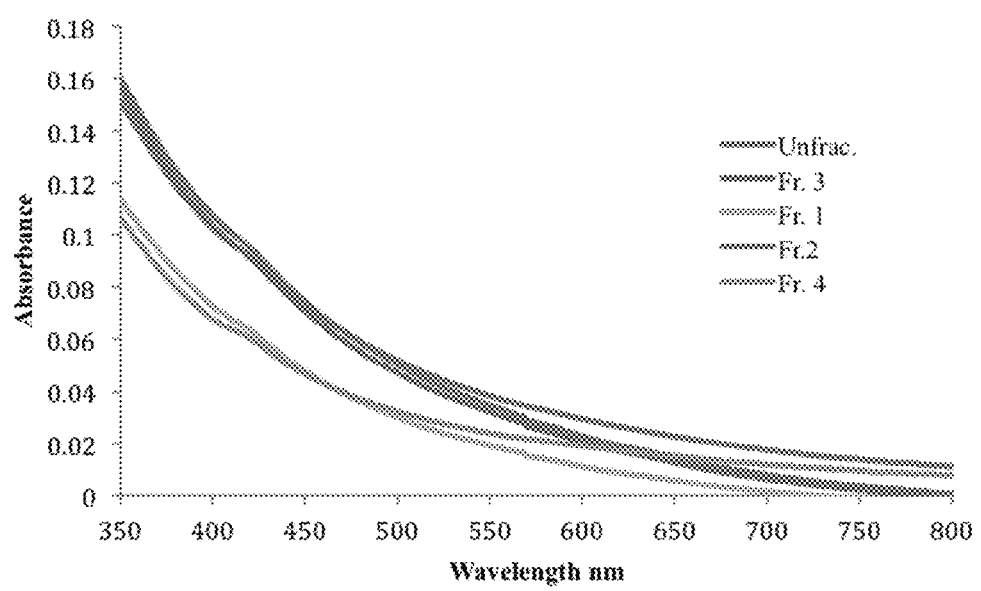
FIG. 8 is a graph that shows absorption spectra of asphaltene thin films.

These results are in agreement with the absorption spectra of asphaltene thin films presented in FIG. 8. Both Fr.1 and Fr.4 have lower absorption in the visible part of light and therefore, will have lower photocurrent. The high fill factor in Fr.4 cell is a result of changing the sealant to lower thickness and easy to process fastelfilm 230110 with 130 micrometer thick film, obtained from Fastel Adhesive.

There were considerable doubts about the suitability of these materials as sanitizer in DSSC at the start of this work, the results proves that different fractions of the asphaltene or asphaltene can be effectively utilized. Asphaltene indeed is an excellent sanitizer in DSSC. Asphaltene the most abundant naturally forming material and undesirable part of crude oil that causes a lot of trouble to most oil refining companies has been shown in this study to be good sensitizer in DSSC. The results obtained show that every step in manufacturing the asphaltene cell has an effect on different cell parameters. According to results shown above, asphaltene solar cells have achieved a fill factor of 65%-70%, when series resistance was minimized, Voc of 0.7-0.8 volt, and photocurrent of 10-13.69 mA/cm2 when UV-$O_3$ treatment were employed and contaminates were eliminated. Therefore, a total overall efficiency of 4.55%-7.0% can be designed by varying the material process. Fraction three (Fr.3) obtained at 90/10 pentane to toluene ratio has produced the best asphaltene solar cell so far with 1.8 total efficiency. Asphaltene photovoltaic as described above also exhibited long-term stability.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

REFERENCES

United States Patent Application No. 20090114283: Dye-sensitized solar cell.
United States Patent Application No. 20040211461: Dye-sensitized solar cell.
U.S. Pat. No. 7,332,782: Dye-sensitized solar cell.
U.S. Pat. No. 7,118,936: Organic dye-sensitized metal oxide semiconductor electrode and its manufacturing method, and organic dye-sensitized solar cell.
U.S. Pat. No. 6,479,745: Dye-sensitized solar cell and method of manufacturing the same.
1. Multi-donor Molecular Bulk Heterojunction Solar Cells: Improving Conversion Efficiency by Synergistic Dye Combinations. Theodulf Rousseau, Antonio Cravino, Thomas Bura, Gilles Ulrich, Raymond Ziessel and Jean Roncali. Journal of Materials Chemistry. In press, available online.
2. Bodipy Derivatives as Donor Materials for Bulk Heterojunction Solar Cells. Theodulf Rousseau, Antonio Cravino, Thomas Bura, Gilles Ulrich, Raymond Ziessel and Jean Roncali. Chemical Communication, 19 Mar. 2009.
3. P. A. Troshin, R. N. Lyubovskaya, V. F. Razumov, Organic solar cells: structure, materials, critical characteristics, and outlook, Nanotechnologies in Russia.3, 5-6 (2008).
4. S. E. Shaheen, D. S. Ginley, G. E. Jabbour, Organic-based photovoltaics: toward low-cost power generation. Mater. Res. Bul. 30, 1 (2005).
5. J. Kalowekamo, E. Baker, Estimating the manufacturing cost of purely organic solar cells. Solar Energy. 83 (2009).
6. C. J. Brabec, Organic photovoltaics: technology and market. Sol. Ener. Mater. (2004).
7. M. Gratzel, Dye-sensitized solar cell. J. Photochem. Photobio. C, 4, (2003).
8. Y. Ruiz-Morales, O. C. Mullins, "Electronic absorption edge of crude oils and asphaltenes analyzed by molecular orbital calculations with optical spectroscopy. Energy & Fuels. 21, 944-952 (2007).
9. C. K. Salmanova, S. F. Akhmedbekova, A. P. Mamedov, S. M. Kyazimov, S. Abdulova, Transformation of resins and asphaltene in photoirradiatio. Chem. Tech. of Fuels & Oils, 43, 5, 415-421 (2007).
10. J. Wang, C. Li, L. Zhang, G. Que, Z. Li, The properties of asphaltenes and their interaction with amphiphiles. Energy & Fuels, 23, 7, 3625-3631 (2009).
11. O. C. Mullins, E. Y. Sheu, A. Hammami, A. Marshall, Asphaltenes. Heavy Oils, and Petroleomics, (Springer, New York, 2007).
12. B. Siffert, J. Kuczinski, E. Papirer, Relationship between electrical charge and flocculation of heavy oil distillation residues in organic medium. J. Colloid Interface Sci. 135, 107-117 (1990).
13. G. B. M. Neves, M. A. de Sousa, A. M. Travalloni-Louvisse, E. F. Lucas, G. Gonz'alez, Characterization of asphaltene particles by light scattering and electrophoresis. Petro. Sci. Tech. 19, 35-43 (2001).
14. R. R. Chianelli, K. Castillo, V. Gupta, A. M. Qudah, B. Torres, R. E. Abujnah, Asphaltene based photovoltaic devices. U.S. Pat. No. 8,389,853, Mar. 5, 2013.
15. J. Ancheyta, G. Centeno, F. Trejo, G. Marroquin, J. A. Garcia, E. Tenorio, A. Tones, Extraction and characterization of asphaltenes from different crude oils and solvents. Energy & Fuel. 16, 5, 1121-1127 (2002).
16. S. Ito, P. Liska, P. Comte, R. Charvet, P. Pechy, U. Bach, L. Schmidt-Mende, S. M. Zakeeruddin, A. Kay, M. K. Nazeeruddin, M. Graetzel, Control of dark current in photoelectrochemical (TiO2/I-I3) and dye-sensitized solar cells. Chem. Comm. 4351-4353 (2005).
17. W. Y. Gan, S. W. Lam, K. Chiang, R. Amal, H. Zhao, M. P. Brungs, Novel TiO2 thin film with non-UV activated super wetting and anti fogging behaviours. J. Mater. Chem. 17, 952-954 (2007).
18. M. Thelakkat, C. Schmitz, H. W. Schmidt, Fully vapor-deposited thin layer titanium dioxide solarcells, Adv. Mater. 14, 577-581 (2002).
19. M. Okuya, K. Nakade, S. Kaneko, Poroustio2 thin films synthesized by aspray pyrolysis deposition(spd) technique and their application to dye-sensitized solar cells. Sol. Ener. Mater. Sol. Cells. 70, 425-435 (2002).
20. S. Ito, P. Chen, P. Comte, M. K. Nazeeruddin, P. Liska, Fabrication of screen-printing pastes from tio2 powders for dye-sensitised solar cells. Prog. Photovoltaics: Res. Appl. 15, 7, 603-612 (2007).
21. T. Hoshikawa, M. Yamada, R. Kikuchi, K. Eguchi, Impedance analysis for dye-sensitized solar cells with a three-electrode system. J. Electroanalytical Chem. 577, 339-348 (2005).
22. H. Anneke, A. Georg, Diffusion in the electrolyte and charge-transfer reaction at the platinum electrode in dye-sensitized solar cells. Electrochimica Acta. 46, 3457-3466 (2001).
23. L. Weiqing, H. Linhua, D. Songyuan, G. Lei, J. Nianquan, K. Dongxing, The effect of the series resistance in dye-sensitized solar cells explored by electron transport and back reaction using electrical and optical modulation. Electrochimica Acta. 55, 2338-2343 (2010).
24. K. Naoki, A. Islam, C. Yasuo, L. Han, Improvement of efficiency of dye-sensitized solar cells based on analysis of equivalent circuit. J. Photochem. Photobio. A: Chem. 182, 296-305 (2006).
25. K. M. Leea, V. Suryanarayananb, K. C. Hoc, High efficiency quasi-solid-state dye-sensitized solar cell based on polyvinyidene fluoride-co-hexafluoro propylene containing propylene carbonate and acetonitrile as plasticizers. J. Photochem. Photobio. A: Chem. 207, 224-230 (2009).
26. B. K. Lee, J. J. Kim, Enhanced efficiency of dye-sensitized solar cells by UV-O3 treatment of TiO2 layer. Curr. Appl. Phys. 9, 404-408 (2009).
27. D. Zhang, T. Yoshida, T. Oekermann, K. Furuta, H. Minoura, Room-temperature synthesis of porous nanoparticulate tio2 films for flexible dye-sensitized solar cells. Adv. Func. Mater. 16, 1228 (2006).

What is claimed is:

1. A photovoltaic device comprising:
a first electrically conductive layer comprising a photosensitized electrode;
at least one photoelectrochemical layer comprising metal-oxide particles, an electrolyte solution comprising at least one asphaltene fraction, wherein the metal-oxide particles are optionally dispersed in a surfactant; and
a second electrically conductive layer comprising a counter-electrode, wherein the second electrically conductive layer comprises one or more conductive elements comprising carbon, graphite, soot, carbon allotropes or any combinations thereof.

2. The device of claim 1, wherein the asphaltene fraction is further defined as being selected from at least one of: a first asphaltene fraction that dissolves in 75:25 volume-to-volume n-pentane to toluene; a second asphaltene fraction that dissolves in 85:15 volume-to-volume n-pentane to toluene; a third asphaltene fraction that dissolves in 90:10 volume-to-volume n-pentane to toluene; and an asphaltene fraction that does not dissolve in 90:10 volume-to-volume n-pentane to toluene.

3. The device of claim 1, wherein the surfactants are selected from a group comprising Triton®, alkyl polyoxides, alkylphenols, alkyl polyglucosides, fatty alcohols, polysorbates, and other non-ionic surfactants.

4. The device of claim 1, wherein the first, second or both electrically conductive layers are flexible metal or a platinum coated indium-tin oxide glass.

5. The device of claim 2, wherein the asphaltene fractions are the second and third fractions.

6. The device of claim 1, wherein the photoelectrochemical layer is defined further as comprising a semiconductor material.

7. The device of claim 1, wherein the electrolyte solution comprises iodide salt or iodine.

8. A photovoltaic cell comprising: a first electrically conductive layer comprising a photo-sensitized electrode; at least one semiconductor layer comprising asphaltene dye-sensitized titanium dioxide particles in an electrolyte, wherein the electrolyte comprises iodide salt and iodine; and a second electrically conductive layer comprising a counter-electrode, wherein the second electrically conductive layer comprises at least one or more conductive elements.

9. The photovoltaic cell of claim 8, wherein the one or more conductive elements comprise carbon, graphite, soot, carbon allotropes or any combinations thereof.

10. The photovoltaic cell of claim 8, wherein the first, second or both electrically conductive layers comprises platinum coated indium-tin oxide glass.

11. The photovoltaic cell of claim 8, wherein the first, second or both electrically conductive layers are flexible metal.

12. A photovoltaic cell comprising: a first electrically conductive layer, comprising a photo-sensitized electrode; at least one semiconductor layer comprising at least one asphaltene fraction, wherein the electrolyte comprises iodide salt and iodine; and a second electrically conductive counter-electrode layer comprising one or more conductive elements, wherein the one or more conductive elements comprise carbon, graphite, soot, carbon allotropes or any combinations thereof.

13. The photovoltaic cell of claim 12, wherein the asphaltene fraction is further defined as being selected from at least one of: a first asphaltene fraction that dissolves in 75:25 volume-to-volume n-pentane to toluene; a second asphaltene fraction that dissolves in 85:15 volume-to-volume n-pentane to toluene; a third asphaltene fraction that dissolves in 90:10 volume-to-volume n-pentane to toluene; and an asphaltene fraction that does not dissolve in 90:10 volume-to-volume n-pentane to toluene.

14. The photovoltaic cell of claim 12, wherein the at least one semiconductor layer comprises a mixture of asphaltene with a sulfide,
wherein the sulfide is selected from a group comprising CoMoS2, CdS, Cu2S, copper indium sulfide, gallium diselenide, and indium gallium sulfide.

15. The photovoltaic cell of claim 14, wherein the sulfide comprises $CoMoS_2$ and the asphaltene to $CoMoS_2$ ration is within a range of 100:1 to 1:1.

16. The photovoltaic cell of claim 12, wherein the first, second or both electrically conductive layers are flexible metal.

17. The photovoltaic cell of claim 12, wherein the first, second or both electrically conductive layers comprises platinum coated indium-tin oxide glass.

18. The photovoltaic cell of claim 12, further comprising metal-oxide particles, wherein the metal-oxide particles comprise titanium oxide.

19. A method of making a photovoltaic device comprising:
fractionating an asphaltene into two or more asphaltene fractions;
depositing at least one layer comprising metal-oxide particles, an electrolyte solution and at least one asphaltene fraction or a mixture of an asphaltene fraction, on a first electrically conductive layer, wherein the first electrically conductive layer comprises a photo-sensitized electrode; and
depositing a semiconductor layer on a second electrically conductive layer, wherein the semiconductor layer comprises carbon, graphite, soot, carbon allotropes or any combinations thereof, wherein the second electrically conductive layer comprises a counter-electrode.

20. The method of claim 19, wherein the asphaltene fractions are further defined as being selected from at least one of: a first asphaltene fraction that dissolves in 75:25 volume-to-volume n-pentane to toluene; a second asphaltene fraction that dissolves in 85:15 volume-to-volume n-pentane to toluene following the first fractionation; a third asphaltene fraction that dissolves in 90:10 volume-to-volume n-pentane to toluene following the second fractionation; and an asphaltene fraction that does not dissolve in 90:10 volume-to-volume n-pentane to toluene following the third fractionation.

21. The method of claim 20, wherein the second and third asphaltene fractions are deposited.

22. The method of claim 19, wherein the one or more sulfides are selected from a group comprising $CoMoS_2$, CdS, $Cu_2S$, $NiMoS_2$, $FeMoS_2$, transition metal sulfides, and indium-gallium sulfide.

23. The method of claim 19, wherein the metal particles comprise at least one of Co, Ni, Fe, Cu, or copper indium gallium diselenide.

24. The method of claim 19, wherein the first, second or both electrically conductive layers are flexible metal, wherein the first, second of both electrically conductive layers comprises platinum coated indium-tin oxide glass.

25. The method of claim 19, wherein the photoelectrochemical layer is defined further as a comprising a semiconductor material.

26. The method of claim 19, wherein the electrolyte solution comprises iodide salt and iodine.

27. The method of claim 19, further comprising the steps of forming a roadway comprising the photovoltaic device by:
fractionating an asphaltene into two or more asphaltene fractions;
depositing the first electrically conductive layer on a road bed;
at least one asphaltene fraction on the first electrically conductive layer; and
at least partially coating the photoelectrochemical layer with the second electrically conductive layer.

28. A photovoltaic device comprising:
a first electrically conductive layer, wherein the first electrically conductive layer comprises a photo-sensitized electrode;
at least one asphaltene fraction on the first electrically conductive layer; and
a second electrically conductive counter-electrode layer comprising one or more conductive elements; wherein the one or more conductive elements comprise carbon, graphite, soot, carbon allotropes or any combinations thereof.

29. The device of claim 28, further comprising metal-oxide particles, wherein the metal-oxide particles comprise titanium dioxide or other photocatalytic materials optionally dispersed in a surfactant.

30. The device of claim 28, further comprising an electron donor substance, wherein the electron donor substance comprises asphaltenes, metal sulfides, mixtures of asphaltenes and metal sulfides, Ruthenium or Rhodium-dye complexes, metal free dyes or any combinations thereof.

31. The device of claim 28, wherein the first, second of both electrically conductive layers comprises platinum coated indium-tin oxide glass.

32. A photovoltaic roadway comprising:
a first electrically conductive layer on a road bed;
at least one asphaltene fraction on the first electrically conductive layer; and at least partially coating the photoelectrochemical layer with the second electrically conductive layer, wherein the voltage created between the first and second electrically conductive layers is gathered along the roadway.

* * * * *